Sept. 30, 1969 W. L. KEADY ET AL 3,469,684

LEAD FRAME PACKAGE FOR SEMICONDUCTOR DEVICES
AND METHOD FOR MAKING SAME

Filed Jan. 26, 1967 2 Sheets-Sheet 1

INVENTORS
WILLIAM L. KEADY
MICHAEL J. ST. CLAIR
JAMES T. HAZEN

BY Owen, Wickersham & Erickson
ATTORNEYS

INVENTORS
WILLIAM L. KEADY
MICHAEL J. ST. CLAIR
JAMES T. HAZEN
BY
Owen, Wickersham & Erickson
ATTORNEYS United States Patent Office 3,469,684
Patented Sept. 30, 1969

3,469,684

LEAD FRAME PACKAGE FOR SEMICONDUCTOR DEVICES AND METHOD FOR MAKING SAME

William L. Keady and Michael J. St. Clair, Woodside, and James T. Hazen, Palo Alto, Calif., assignors to Advalloy, Inc., Woodside, Calif., a corporation of California Filed Jan. 26, 1967, Ser. No. 611,944
Int. Cl. B65h 75/02; H05k 5/02
U.S. Cl. 206—59 5 Claims

ABSTRACT OF THE DISCLOSURE

A package for semiconductor devices is formed on a lead frame preferably integral with similar frames in the form of a flexible strip, the package comprising a connector chip supporting an attached semiconductor device whose terminals engage and are thereby electrically connected to the inner ends of conductive paths on the connector chip. The latter is supported in a substrate so that the outer ends of its conductive paths are in register with and electrically connected to the lead portions of the surrounding lead frame. Also included in the invention is the method for assembling the aforesaid package.

This invention relates to an improved package for mounting a semiconductor device within a lead frame and also to a method for assembling such packages in quantity.

In order to utilize semiconductor devices such as integrated circuit dice in electronic apparatus, they must be mounted or packaged so as to receive adequate support and protection and, in addition, they must be combined with some means to provide electrical paths to the terminals of the device. Prior to the present invention these requirements were accomplished by mounting the semiconductor device within a lead frame on a substrate member and thereafter interconnecting its terminals with the lead tips of the lead frame by means of very fine wire. While such a procedure was satisfactory to a degree, it generally required time-consuming and highly skilled labor and therefore was expensive and a restraint to large volume production and a lower unit cost. Also, these fine wires often were subject to breakage, particularly at their end connections to the lead frame and semiconductor terminals, thus seriously impairing the reliability of the product.

A general object of the present invention is to provide a combined semiconductor and lead frame package that solves the aforesaid problems.

A more specific object of the present invention is to provide a semiconductor and lead frame package that eliminates the need for any fine wire interconnections between the semiconductor terminals and the tips of the leads on the lead frame. In our invention this is accomplished broadly by an intermediate connector chip which receives the terminals of both the lead frame and the semiconductor device in direct contact, so that once assembled as a package these contacts cannot be broken and maximum reliability is achieved. The connector chip is supported by a base member which is initially located within a window area of a lead frame from whose sides extend one or more lead portions, and it fits in a predetermined position within a recessed area of the base member. It is provided with a surface film pattern of conductive paths from its outer edge towards a central area so that when the semiconductor device such as an integrated circuit die is bonded to it, the terminals of the device are connected directly to the inner ends of the conductive paths thereon. Similarly, the lead portions of the lead frame extending within the base member are bonded directly to the outer ends of the conductive paths on the connector chip to complete the electrical connections from the lead frame through the connector to the semiconductor device. An advantage afforded by the connector chip is that it increases the versatility of a simplified form of lead frame. The variations required to accommodate different semiconductor devices can easily be made in the connector chip which may be made inexpensively from well-known ceramic or plastic materials and surface films.

Accordingly, another object of our invention is to provide a semiconductor and lead frame package that is easier and more economical to manufacture and assemble. Our invention greatly reduces the need for highly skilled labor and instead makes possible an increased rate of production of precision semiconductor packages using automated apparatus. The make-up of our package enables the essential components to be pretested so that a maximum yield of fully operable and finally assembled products is attained.

Another object of our invention is that it facilitates the use of a simplified form of lead frame wherein the lead portions may be straight and extend inwardly from the sides of the lead frame window, a factor which contributes to a reduction in the cost of combining lead frames and semiconductor devices from the methods heretofore practiced in the art.

Still another object of the present invention is to provide a combined lead frame and semiconductor device package that is extremely versatile in that it can accommodate a large variety of semiconductor devices and lead frames, since the intermediate connector chip can be easily produced in a multitude of forms to fit the various semiconductor elements. Yet the assembly of our package and its main supporting elements may remain relatively simple and uniform.

A further object of the present invention is to provide a novel method for manufacturing a lead frame and semiconductor device package and one that is particularly adaptable for automated manufacturing apparatus.

Another object of our invention is to provide a method for making semiconductor packages combined with lead frames in a strip form so that a large number of such packages can be retained with the lead frame strip rolled in a reel to facilitate shipping, storage, and handling during subsequent use.

The foregoing and other objects, advantages, and features of the present invention will become apparent from the following detailed description taken with the accompanying drawings, in which:

FIG. 3 is a view in perspective showing the first step of attaching a typical semiconductor device to a connector chip;

FIG. 4 is a view in perspective showing the next step of placing the connector chip in a base member;

FIG. 5 is a view in perspective showing progressively the final assembly of the combined semiconductor device, connector chip and base member with a lead frame according to the invention.

Figure 1:
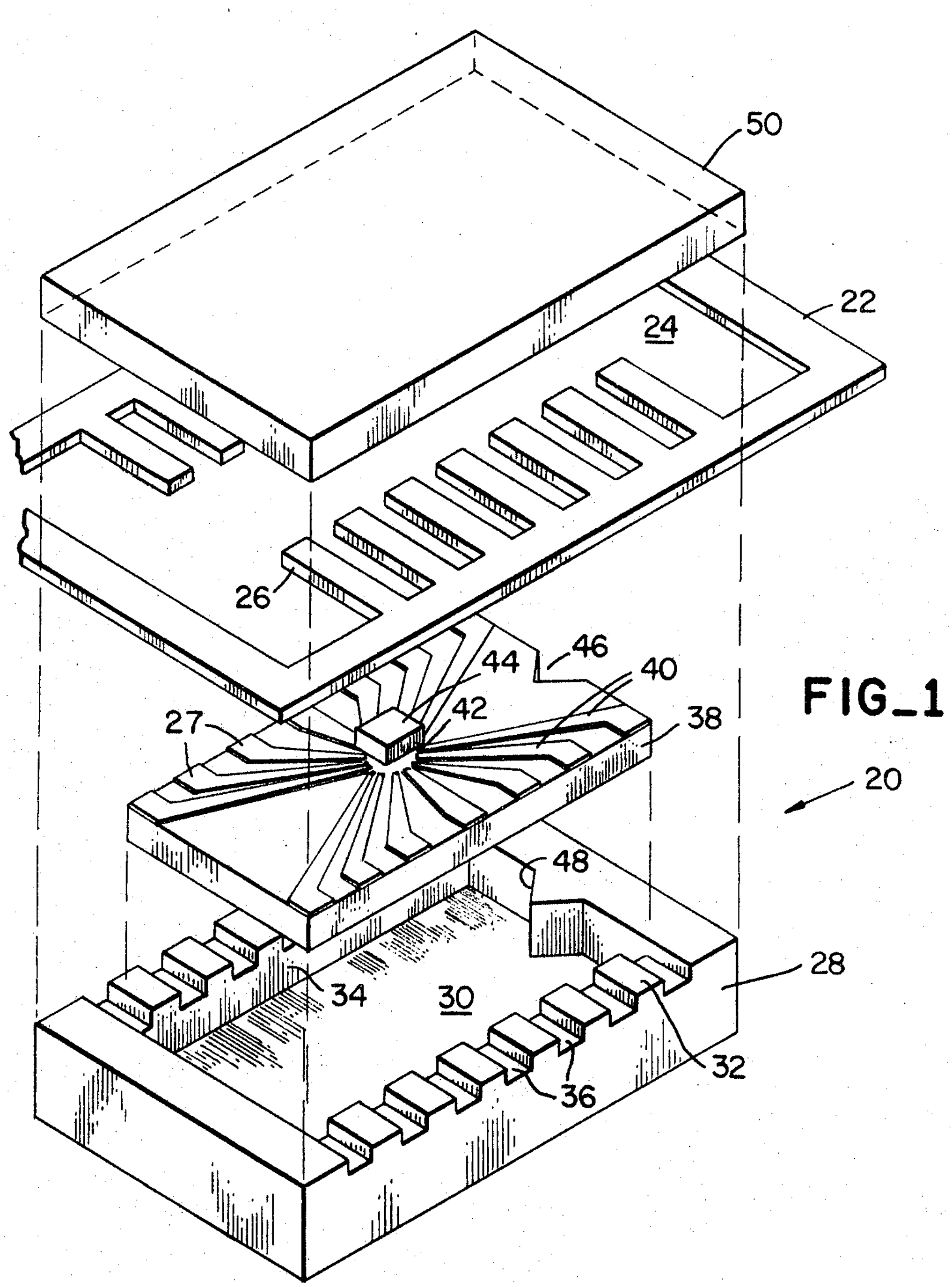
FIG. 1 is an enlarged exploded view in perspective showing a semiconductor and lead frame package embodying the principles of the present invention.

In the drawings, FIG. 1 shows an exploded view of an integrated circuit package embodying the principles of the present invention, a unit that may be varied in its internal electronic circuitry and characteristics and yet can be assembled in large quantities by a unique combination of method steps as will be described later. In broad terms, the assembled package 20 comprises a lead frame 22 of relatively thin flexible material having a window 24 with opposite side and end edges. Extending inwardly from each of two opposite side or end edges in the embodiment shown are a series of lead portions 26 that terminate within the window area at predetermined spaced apart locations relative to each other. It is understood that the lead frame may have various configurations with any number of lead portions attached to or integral with the side and end portions.

Located within the window area of the lead frame is a substrate base member 28 of the package 20. This latter member may be rectangular in plan form and is made of a suitable nonconductive plastic or ceramic material. Its function is to secure and maintain the lead bars in a proper spaced apart orientation and to provide a protective retaining body or housing for a much smaller integrated circuit die. This substrate base member 28 has a central recessed area 30 which forms ridge-like side and end portions 32 and 34. Any of these side or end portions may be castellated to provide spaced apart notches 36 of the desired dimensions and spacing to accommodate the lead portions 26 of the lead frame 22. When the substrate member 28 is properly positioned within the lead frame window, the lead portions extend inwardly beyond the side or end ridge portions a uniform predetermined amount.

Seated within the recessed area of the substrate base member is an intermediate substrate unit or connector chip 38 to which the ends of the lead portions are attached. This intermediate connector unit is made of a non-conductive material such as a ceramic and is provided with a surface layer film of conductive material formed in a pattern that provides conductive paths as on integrated circuit devices from one or more of its sides inwardly toward the center of the connector chip. For example, in the embodiment shown, the paths 40 extend inwardly from opposite side edges of the connector chip 38 and terminate at contact points 42 arranged in a desired spaced apart pattern that is selected to be compatible with a terminal pattern on an integrated circuit die 44 to be attached. This latter die is fixed to the chip near or at the center thereof by a suitable bonding material with its terminals registered with and bonded to the contact points 42 of the connector chip. It is apparent that any form of integrated circuit die (or a plurality of dice) can be so mounted on the chip that has a surface pattern of conductive paths with contact points compatible therewith and also an overall shape compatible with the recessed area 30 of the substrate base member 28.

The intermediate connector chip 38 with its integrated circuit die fixed thereto may be held in position permanently within the substrate recess 30 by a suitable bonding material. Its orientation within and relative to the substrate member is assured by providing it with a plan form shape which conforms to that of the recessed area on the substrate, so that it will fit therein only when in the proper position. For example, the connector chip may have a locator notch 46 which corresponds with a similar projection 48 within the recessed area.

The lead portions 26 extending from the lead frame 22 are secured to the side portions of the substrate member and preferably within the positioning notches 36, the ends of the lead portions being bonded electrically, as by welding, to the connector chip at the outer ends of the conductive paths 40 along opposite sides of the intermediate connector.

Figure 2:
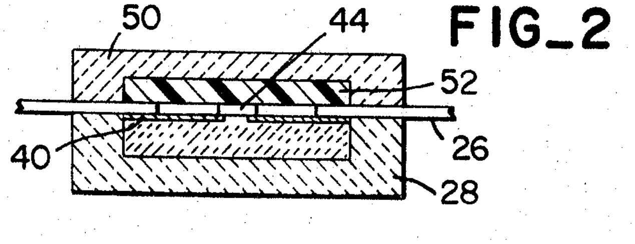
FIG. 2 is an enlarged end view in section of the package of FIG. 1 as it appears in its completed form with the size of the various elements distorted in some instances to make them more visible.

To complete the package and make it a fully enclosed unit, a cover 50, preferably of the same plan form shape of the substrate base member 28, may be fixed thereto by suitable bonding material. Before the cover is placed in position additional potting material indicated by the numeral 52 in FIG. 2 may be used to cover the intermediate chip and its integrated circuit die. With the cover in place, the finished package 20 is a completely insulated and protected unit from which extend the lead portions 26 that may then be connected to other components in an electronic system.

A unique method of assembly of our semiconductor package 20 provides several advantages and will now be described with reference to FIGS. 3 to 5. Essentially, the method entails the joining together of the various components previously described so that the appropriate electrical connection points are aligned in direct contact to provide electrical continuity without the need for separate bonding wires and the like. The form of the individual components and their interrelationships makes it possible to assemble the packages 20 on a continuous conveyor line system utilizing the lead frames in strip form as a carrier device.

Figures 3, 4, 5:
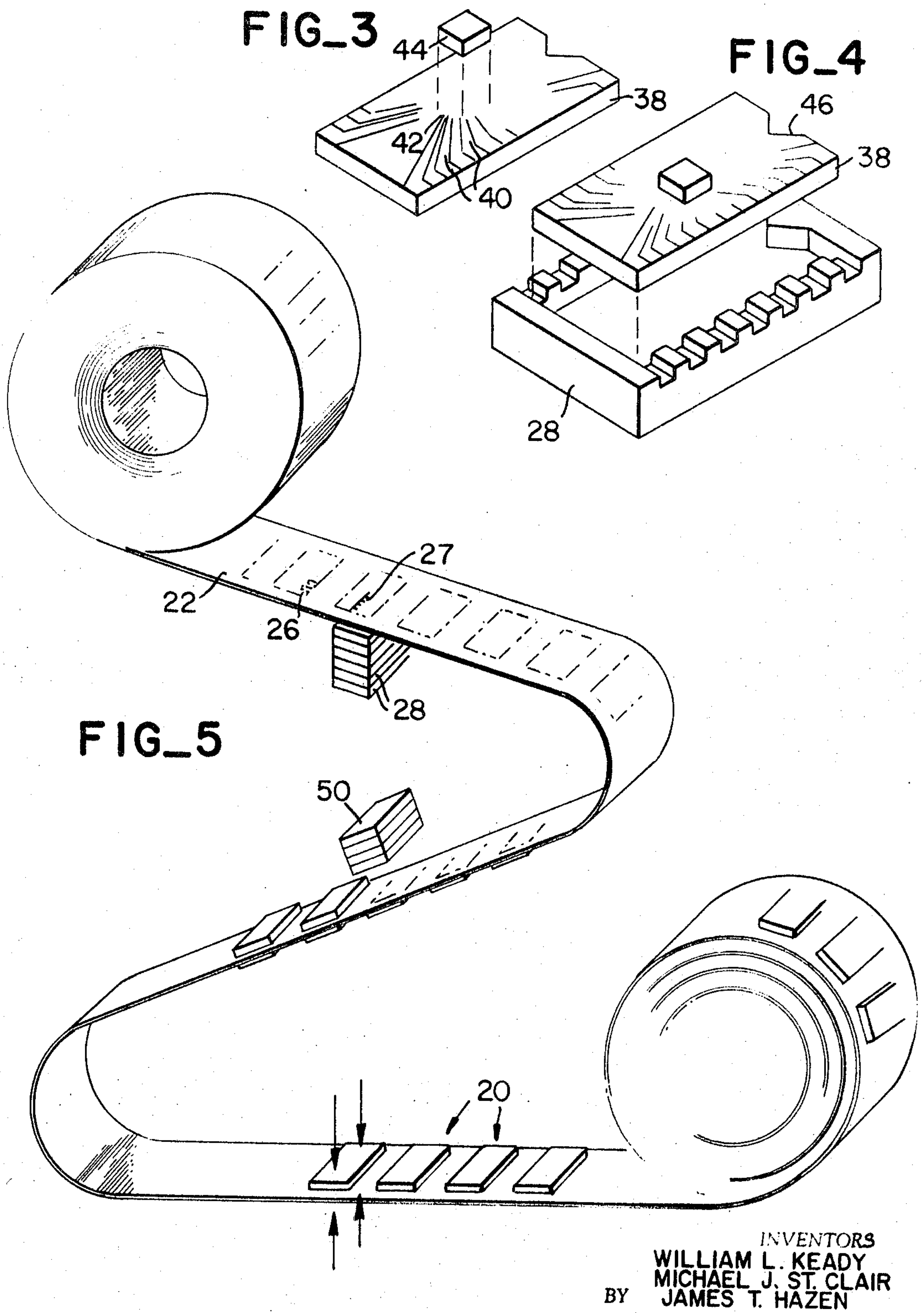
FIGS. 3–5 are enlarged views showing somewhat schematically the progressive method steps for assembling our package according to the present invention.

The first step of our method as shown in FIG. 3, is to attach a semiconductor device such as an integrated circuit die 44 to the connector chip 38. In this step the die must be positioned with precision so that its terminals come into direct contact with the inner end terminals 42 of the conductive paths 40 on the connector chip. This may be accomplished rapidly and efficiently with suitable positioning devices available in the field of microelectronics. After the semiconductor device has been installed on the connector chip, this sub-assembly may be easily tested by appropriate equipment for electrical characteristics and continuity.

In the next step, shown in FIG. 4, the pretested connector chip 38 with the integrated circuit die fixed thereto is placed in and bonded to the substrate base member 28. The locator notch 46 or an equivalent means assures the proper orientation of the connector chip within the base member.

In the third major step of our method for making a large plurality of the semiconductor package 20, as shown in FIG. 5, a long flexible strip of integrally connected lead frames 22 is provided which may be conveniently supplied in a reel form. Essentially, each frame comprises a window in the strip in which extend an array of lead bars 26 having a predetermined width and spacing precisely equal to that of the conductive path ends along opposite sides of a connector chip previously installed in a substrate base member. Thus, when each lead frame is placed on a base member its lead bars or portions 26 automatically register and come in contact with the outer ends pads 27 of these conductive paths on the connector member and are in position to be connected permanently. This latter step of electrically connecting the lead bars may be accomplished by various means, such as welding, either individually on each lead bar or on all of the lead bars simultaneously using suitable apparatus. After this, a suitable potting compound may be applied to the electrically connected lead bars and connector chip just before a protective top member 50 of non-conductive material having generally the same plan form is attached. The top member may be attached to the base member by means of a suitable bonding agent and the application of a relatively small amount of pressure when the package is supported in a platen. After completion of the aforesaid assembly steps, the packages can remain attached to the lead frame strip and can thus be rolled back into a reel form. This greatly facilitates handling and shipment and also the subsequent use by electronic component manufacturers.

Our package 20 provides several inherent advantages, an important one being the fact that it facilitates the use of lead frames having a simple configuration which can be combined with a wide variety of integrated circuit devices having terminals arranged in various patterns. It is understood that the particular lead frame which is shown having straight lead portions is merely illustrative and does not limit the invention. Also, the connector chip 38 with its surface film pattern of conductor paths whose outer ends are spaced to match the spacing of the lead portions of the lead frame can be easily manufactured with various surface film patterns so that the inner ends of its conductor paths will correspond to the terminal arrangements on a wide variety of integrated circuit dice. It is understood also that one connector chip may accommodate a multiplicity of integrated circuit dice. In all cases, the terminal connections between the integrated circuit die and the connector chip can be made permanently yet with comparative ease when these two components are bonded together, and this sub-assembly can be thoroughly tested for electrical characteristics before being connected to the lead frame. When the connector chip 38 is then placed with its substrate base member 28 in the desired position the lead portions can be easily aligned by it and bonded to their proper contacts. The end result is an unusually high productive yield of fully operable packages during the final assembly process.

It should be apparent from the foregoing that the present invention provides a semiconductor package and a method for making same that overcomes and eliminates several serious prior art problems in previous packages, such as the need to handle and make reliable connections between a large number of terminals with extremely fine wire. Thus, our package is not only more reliable but easier and more economical to manufacture.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

We claim:

1. A semiconductor package comprising:
- a lower substrate member of non-conductive material having an upper recessed area forming opposite side ridges, and notches spaced apart in said ridges;
- an intermediate connector chip fitted within said recessed area in a predetermined position having a dielectric base portion;
- a series of electrically conductive paths on said connector chip arranged in a predetermined pattern extending inwardly from outer ends located near the edge of said connector chip and having inner terminals at spaced apart locations thereon;
- a semiconductor device mounted on said connector chip and electrically connected with said inner terminals;
- a lead frame having a window larger than said lower substrate member with lead portions extending inwardly from the side edges thereof, said substrate member being located within said window area with said notches in said side ridges receiving and supporting said lead portions that extend within said substrate member and are bonded to said conductive paths of said connector chip;
- and a top member located on and bonded to said substrate member while covering said connector chip.

2. A semiconductor package as described in claim 1 wherein said connector chip has substantially a shape congruent to said recessed area of said lower substrate member and fits therein in a predetermined position relative to said substrate member.

3. A semiconductor package comprising:
- a base substrate member of non-conductive material having an upper recessed area;
- an intermediate connector chip fitted within said recessed area in a predetermined position;
- a series of electrically conductive paths on said connector chip arranged in a predetermined pattern extending inwardly from near the edge of said connector chip and with inner terminals at spaced apart locations thereon;
- a semiconductor device mounted on said connector chip having terminals in direct contact with said inner terminals;
- a series of conductive lead members extending within said substrate member and bonded to said conductive paths near the opposite edges of said connector chip;
- and a top member located on and bonded to said substrate member while covering said connector chip, said lead members extending outwardly from said connector chip between said top member and said base substrate member.

4. A coil of semiconductor packages comprising in combination:
- a coiled elongated flexible carrier strip having spaced apart windows along its length;
- a plurality of lead portions extending inwardly towards each other from opposite sides of each said window on said carrier strip;
- each substrate base member located within a window of said carrier strip, said substrate having a recessed central area surrounded by bordering ridge portions at least one pair of said ridge portions on opposite sides of said recessed area having a series of spaced apart notches for receiving and supporting said lead portions in a spaced apart arrangement;
- a connector chip situated within said recessed area of each said substrate base member, said chip having a plurality of contact areas on its opposite sides compatible with the spacing of and connected to the ends of said lead portions, and a series of conductive paths on said chip converging inwardly and terminating at spaced apart inner contacts;
- an integrated circuit die fixed to said connector chip with its terminals in register and directly engaged with said inner contacts;
- and a top member fixed to said substrate member covering said connector chip and said integrated circuit die thereby forming an enclosed package within a window area of said carrier strip and attached to said carrier strip by said lead portions.

5. A method for producing a plurality of integrated circuit packages connected to lead frames in a continuous coilable strip comprising the steps of:
- providing a coilable strip of flexible material having spaced apart windows forming frames with lead portions extending inwardly from the sides of each window;
- providing a sub-assembly including a connector chip having surface paths of conductive material extending inwardly from outer contacts near its outer edge to spaced apart inner contacts;
- fixing an integrated circuit die to said connector chip with its terminals engaged with said inner contacts;
- providing a substrate base member having a recessed area;
- placing said connector chip within the recess of said substrate base member;
- progressively attaching said integrated circuit packages to adjacent windows of said coilable strip by locating a substrate base member with its sub-assembly in place within each window of said strip so that the outer contacts of said connector chip register with the ends of lead portions extending within that window;
- attaching the ends of the lead portions to the outer contacts of the connector chip;
- encapsulating the connector chip, the substrate base member and lead portions of the lead frame therein with a potting material; installing a rigid cover of non-conductive material over the substrate member;
- and winding the assembled packages in a reel form for shipment and handling.

(References on following page)

References Cited

UNITED STATES PATENTS

| | | | |
|---|---|---|---|
| 3,171,187 | 3/1965 | Ikeda et al. | |
| 3,141,999 | 7/1964 | Schneider. | |
| 3,271,634 | 9/1966 | Heaton. | |
| 3,374,537 | 3/1968 | Doelp. | |
| 3,381,372 | 5/1968 | Capano. | |
| 3,050,186 | 8/1962 | Niles | 206—59 |
| 3,239,719 | 3/1966 | Shower | 174—68.5 X |
| 3,292,241 | 12/1966 | Carroll. | |

FOREIGN PATENTS

| | | |
|---|---|---|
| 1,015,909 | 1/1966 | Great Britain. |
| 1,048,624 | 1/1969 | Germany. |

DARRELL L. CLAY, Primary Examiner

U.S. Cl. X.R.

29—626, 627, 193.5; 113—119; 174—52; 206—56; 317—101